United States Patent
Rogers et al.

(10) Patent No.: US 10,280,504 B2
(45) Date of Patent: May 7, 2019

(54) ION-IMPLANTED, ANTI-REFLECTIVE LAYER FORMED WITHIN SAPPHIRE MATERIAL

(71) Applicant: Apple Inc., Cupertino, CA (US)

(72) Inventors: Matthew S. Rogers, Cupertino, CA (US); Avery P. Yuen, Cupertino, CA (US); Xianwei Zhao, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 186 days.

(21) Appl. No.: 15/269,899

(22) Filed: Sep. 19, 2016

(65) Prior Publication Data

US 2017/0088940 A1 Mar. 30, 2017

Related U.S. Application Data

(60) Provisional application No. 62/232,990, filed on Sep. 25, 2015.

(51) Int. Cl.
| | |
|---|---|
| *C23C 14/48* | (2006.01) |
| *H01L 33/56* | (2010.01) |
| *H01L 33/58* | (2010.01) |
| *C04B 41/00* | (2006.01) |
| *C23C 14/08* | (2006.01) |

(52) U.S. Cl.
CPC .............. *C23C 14/48* (2013.01); *C04B 41/00* (2013.01); *C23C 14/081* (2013.01)

(58) Field of Classification Search
None
See application file for complete search history.

(56) References Cited

U.S. PATENT DOCUMENTS

| | | |
|---|---|---|
| 4,088,799 A | 5/1978 | Kurtin |
| 4,200,506 A | 4/1980 | Dreschhoff et al. |
| 4,282,290 A | 8/1981 | Pellicori |
| 4,316,385 A | 2/1982 | DeVries et al. |
| 4,348,803 A | 9/1982 | Sasaki |

(Continued)

FOREIGN PATENT DOCUMENTS

| | | |
|---|---|---|
| CN | 101142598 | 3/2008 |
| CN | 102066624 | 5/2011 |

(Continued)

OTHER PUBLICATIONS

Burnett, P.J. et al., "An investigation of ion implantation-induced near-surface stresses and their effects in sapphire and glass," Journal of Materials Science 20, Dec. 1985, vol. 20, Issue 12, 23 pages.

(Continued)

*Primary Examiner* — Jeffrey D Washville
(74) *Attorney, Agent, or Firm* — Dorsey & Whitney LLP

(57) ABSTRACT

A sapphire structure including an ion-implanted, anti-reflective layer and a method of forming an ion-implanted, anti-reflective layer within a sapphire component is disclosed. The method includes forming an ion-implanted layer in a sapphire material at a first depth, and annealing the sapphire material to a second depth. The second depth may be greater than or equal to the first depth. The ion-implanted layer may have a first index of refraction, and the sapphire material may have a second index of refraction different from the first index of refraction.

19 Claims, 11 Drawing Sheets

(56) References Cited

U.S. PATENT DOCUMENTS

| | | | |
|---|---|---|---|
| 4,732,867 A | 3/1988 | Schnable | |
| 4,849,299 A | 7/1989 | Loth | |
| 5,262,392 A | 11/1993 | Hung et al. | |
| 5,697,998 A | 12/1997 | Platus et al. | |
| 5,702,654 A * | 12/1997 | Chen | C04B 41/009 |
| | | | 264/82 |
| 5,709,471 A | 1/1998 | Platus | |
| 6,222,194 B1 | 4/2001 | Regan | |
| 6,413,589 B1 | 7/2002 | Li | |
| 6,562,129 B2 | 5/2003 | Hasegawa et al. | |
| 6,982,181 B2 | 1/2006 | Hideo | |
| 7,305,260 B2 | 12/2007 | Vuori et al. | |
| 7,456,080 B2 | 11/2008 | Gadkaree | |
| 7,478,570 B2 | 1/2009 | Mian et al. | |
| 7,544,257 B2 | 6/2009 | Johnson et al. | |
| 7,726,532 B2 | 6/2010 | Gonoe | |
| 7,902,527 B2 | 3/2011 | Chen et al. | |
| 7,910,862 B2 | 3/2011 | Yoshie | |
| 8,309,431 B2 | 11/2012 | Nguyen et al. | |
| 8,313,989 B2 | 11/2012 | Ohnuma et al. | |
| 8,396,582 B2 | 3/2013 | Kaushal et al. | |
| 8,616,024 B2 | 12/2013 | Cornejo et al. | |
| 8,716,836 B2 | 6/2014 | Joo | |
| 8,778,463 B2 | 7/2014 | Park et al. | |
| 8,815,705 B2 | 8/2014 | Kato | |
| 8,937,689 B2 | 1/2015 | Prest et al. | |
| 9,092,187 B2 | 7/2015 | Kwong | |
| 9,416,442 B2 | 8/2016 | Memering | |
| 9,623,628 B2 | 4/2017 | Kwong | |
| 9,828,668 B2 | 11/2017 | Memering et al. | |
| 2003/0166311 A1 | 9/2003 | Miyazawa | |
| 2005/0133798 A1 | 6/2005 | Jung et al. | |
| 2006/0019035 A1 | 1/2006 | Munz et al. | |
| 2006/0060796 A1 | 3/2006 | Subramanian | |
| 2007/0172661 A1 | 7/2007 | Fechner et al. | |
| 2009/0081424 A1 | 3/2009 | Gomi | |
| 2010/0103140 A1 | 4/2010 | Hansson | |
| 2011/0171429 A1 | 7/2011 | Huang et al. | |
| 2011/0204532 A1 | 8/2011 | Kinoshita et al. | |
| 2012/0015799 A1 | 1/2012 | Shonai | |
| 2012/0236526 A1 | 9/2012 | Weber | |
| 2014/0272298 A1 * | 9/2014 | Memering | C23C 28/04 |
| | | | 428/142 |

FOREIGN PATENT DOCUMENTS

| | | |
|---|---|---|
| EP | 1585166 | 10/2005 |
| EP | 2388980 | 11/2011 |
| JP | S5633601 | 4/1981 |
| JP | 5795899 | 6/1982 |
| JP | S6325602 | 3/1988 |
| JP | H06027317 | 2/1994 |
| JP | 2008094634 | 4/2008 |
| JP | 2009216452 | 9/2009 |
| JP | 2011524326 | 9/2011 |
| KR | 20040023447 | 3/2004 |
| KR | 20110034889 | 4/2011 |
| KR | 20110039962 | 4/2011 |
| TW | 200915463 | 4/2009 |
| TW | M438642 | 10/2012 |
| WO | WO2008/122296 | 10/2008 |
| WO | WO2009/128315 | 10/2009 |
| WO | WO2009/151160 | 12/2009 |

OTHER PUBLICATIONS

Demaree JD et al., "Modification of single-crystal sapphire by ion implantation," Nuclear Instruments & Methods in Physics Research, Section—B:Beam Interactions with Materials and Atoms, Elsevier, Amsterdam, NL, vol. 127-128, May 2, 1997, pp. 603-607.

Gea et al., "Optical Switching of Coherent VO2 Precipitates Formed in Sapphire by Ion Implantation and Annealing," Applied Physics Letters, AIP, American Institute of Physics, Melville, NY, vol. 68, No. 22, pp. 3081-3083, May 27, 1997.

Hioki et al., "Modification of the Mechanical Properties of Ceramics by Ion Implantation," Nuclear Instruments and Methods in Physics Research, vol. 839, No. 1-4, pp. 657-664, Mar. 2, 1989.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Kobrin, P.H. et al., "Compressive thin films for increased fracture toughness," Proceedings of SPIE, vol. 683, Jan. 1, 1986-Aug. 19, 1986, 5 pages.

Kunlin, "Basics of Material Engineering," Tsinghua University Press, 3 pages, 2003.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

McHargue et al., "Influence of Oxygen Ion Implantation on the Damage and Annealing Kinetics of Iron-Implanted Sapphire," Nuclear Instruments and Methods in Physics Research, pp. 188-192, 2000.

McHargue et al., "The Structure and Properties of Ion-Implanted AL2O3," Nuclear Instruments and Methods in Physics Research, Section—B: Beam Interactions with Materials and Atoms, Elsevier, Amsterdam, NL, vol. 810, No. 1, Part 1, pp. 569-573, May 1, 1985.

Saito et al., "Coloration of Sapphire by Metal-Ion Implantation," 362 Japanese Journal of Applied Physics, 24 (1985) Nov., No. 11, Part II, Tokyo, Japan.

White et al., "Ion Implantation Annealing of Crystalline Oxides and Ceramic Materials," Nuclear Instruments and Methods in Physics Research Section B: Beam Interations with Materials and Atoms, vol. 32, No. 1-4, pp. 11-22, May 1, 1988.

Wolk et al., "Synthesis of GaN Nanocrystals by Sequential Ion Implantation," Applied Physics Letters, AIP, American Institue of Physics, Melville, NY, vol. 70, No. 17, pp. 2268-2270, Apr. 28, 1997.

* cited by examiner

ION-IMPLANTED, ANTI-REFLECTIVE LAYER FORMED WITHIN SAPPHIRE MATERIAL

CROSS-REFERENCE TO RELATED APPLICATION

This application is a nonprovisional patent application of and claims the benefit to U.S. Provisional Patent Application No. 62/232,990, filed Sep. 25, 2015 and titled "Ion-Implanted, Anti-Reflective Layer Formed within Sapphire Material," the disclosure of which is hereby incorporated herein by reference in its entirety.

FIELD

The disclosure relates generally to sapphire material, and more particularly, to a sapphire structure including an ion-implanted layer and a method of forming an ion-implanted layer within a sapphire structure.

BACKGROUND

Electronic devices continue to become more prevalent in day-to-day activities. For example, smart phones, tablet computers, and electronic devices continue to grow in popularity, and provide everyday personal and business functions to its users. These electronic devices may include displays utilized by the user to interact (e.g., through input/output operations) with the electronic devices and/or receive information therefrom.

Conventionally, these displays are made using reinforced or modified glass. However, these glass displays may still be susceptible to damage. Specifically, these conventional screens may scratch, chip or crack when an undesirable impact event or force (e.g., dropped, crushed) occurs with the electronic device. Damage to the screen of the electronic device may render the device partially or completely inoperable and/or may prevent the user from utilizing the electronic device for its intended purposes.

Therefore, it is desirable to form a cover that is both strong and has desired optical properties.

SUMMARY

A method of forming an anti-reflective sapphire component is disclosed. The method comprises forming an ion-implanted layer in a sapphire material at a first depth, and annealing the sapphire material to a second depth. The second depth is greater than or equal to the first depth. Additionally, the ion-implanted layer has a first index of refraction, and the sapphire material has a second index of refraction different from the first index of refraction.

A sapphire component comprising an ion-implanted layer formed within the sapphire component and below an exterior surface of the sapphire component is disclosed. The ion-implanted layer has a first index of refraction. The sapphire component also comprises an annealed layer positioned between the exterior surface and the ion-implanted layer. The annealed layer has a second index of refraction that is different than the first index of refraction.

An electronic device is disclosed. The electronic device comprises a housing, a display module positioned within the housing, and a sapphire cover coupled to the housing and positioned over the display module. The sapphire cover comprises at least one ion-implanted layer formed within the sapphire cover. The at least one ion-implanted layer has a first index of refraction. The sapphire cover also comprises an annealed layer positioned above the at least one ion-implanted layer and forming an exterior surface of the sapphire cover. The annealed layer has a second index of refraction different than the first index of refraction.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
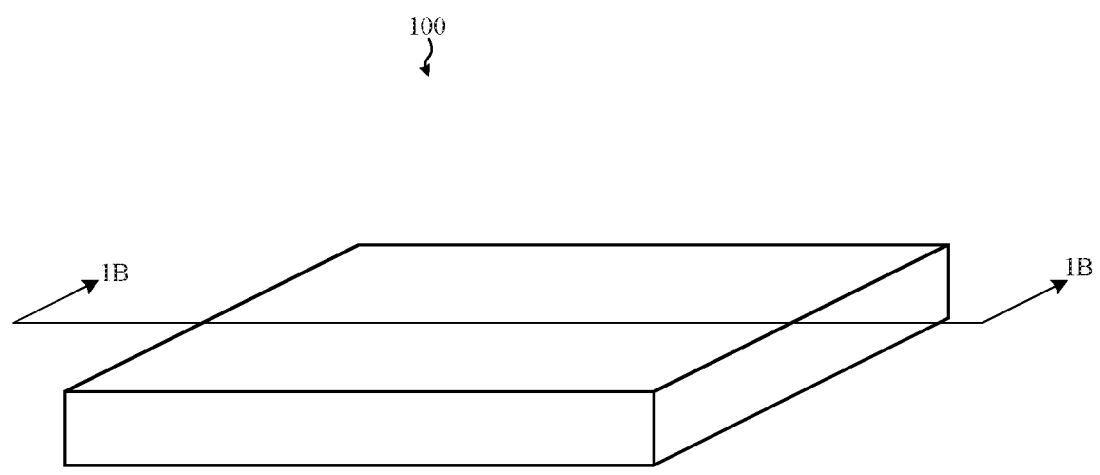
FIG. 1A shows an isometric view of a sapphire component, according to embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates generally to sapphire material, and more particularly, to a sapphire structure including an ion-implanted layer and a method of forming an ion-implanted layer within a sapphire structure.

In a particular embodiment, the sapphire material, structure or component can include an ion-implanted layer formed or positioned within the sapphire component and a top, annealed layer forming an exterior surface of the sapphire component. The ion-implanted layer may be positioned between the top, annealed layer and a remaining or materially unaltered, interior portion of the sapphire component. The top, annealed layer, which is substantially free from the ions implanted in the sapphire component, is annealed to substantially heal the annealed layer from surface defects (e.g., cracks, artifacts, breaks and so on) formed during the ion implantation process. The ion-implanted layer may be formed by performing an ion-implantation process on the sapphire material or component. Additionally, the top, annealed layer may be formed by performing an annealing process on the sapphire material, subsequent to performing the ion-implantation process.

The ion-implanted layer of the sapphire component may include distinct optical properties from the remaining portions of the sapphire component. One or more ion-implanted layers may be used to reduce the reflective properties of the sapphire to produce an anti-reflective sapphire component. In particular, by implanting or embedding ions into a layer or region of the sapphire component, the amount of light that is reflected off an ion-treated surface of the sapphire may be reduced as compared to an untreated sapphire surface. In some instances, the ion-implanted layer may include an index of refraction that is lower than the sapphire material, which forms the remaining portion of the sapphire component. The formation and/or inclusion of the ion-implanted layer having the lower index of refraction lowers the index of refraction for an initial layer of the sapphire component which light passes through. This may result in a sapphire component having a treated surface that is less reflective than an untreated surface. The reduction in the reflective characteristics of the sapphire component may improve functionality and usability of the sapphire structure when the sapphire structure is used, for example, as a cover for an electronic device.

An ion-implanted layer may reduce reflectivity of the sapphire component by absorbing at least some of the light incident on the surface of the sapphire component. In one example, the ion-implanted layer may increase the amount of light that passes through the top, annealed layer of the sapphire component, into the ion-implanted portion, and subsequently to the internal layer of the sapphire component. Once the light passes into and/or through the ion-implanted portion, the light may be absorbed and/or dispersed throughout and contained within the internal layer and/or ion-implanted layer without being reflected back through the top, annealed layer. In some cases, a significant amount of the incident light is absorbed and/or dispersed throughout the internal layer and/or ion-implanted layer, and the amount of light that is reflected off the sapphire component is reduced.

Further, the inclusion of the ion-implanted layer may reduce reflectivity of the sapphire component by creating a phase shift in the reflective light to cause a destructive phase interaction and/or to attenuate the light reflecting from the ion-implanted layer. In a non-limiting example, the ion-implanted layer includes a thickness that is a fraction of a center wavelength of the incident light, such that a first portion of light passing through the top, annealed layer to the ion-implanted layer reflects off a first or upper interface of the ion-implanted layer and second portion of light reflects off a second or lower interface of the ion-implanted layer. As a result of the specific thickness of the ion-implanted layer, the second reflective light may reflect with a quarter-wavelength phase shift from the first reflective light portion. The quarter-wavelength phase shift in the second reflective light portion may cause a destructive phase interaction with the first reflective light portion, which ultimately may reduce and/or substantially attenuate the amount of reflective light of the treated surface of the sapphire. The light incident light includes any visible light within the visible light spectrum (e.g., wavelengths between 390 nanometers (nm) and 700 nm). Additionally, the light reflected at a quarter-wavelength phase shift is also within the visible light spectrum, but as discussed above, is shifted a quarter-wavelength from the incident light.

The top, annealed layer of the sapphire component may heal, rework and/or restore the material of the sapphire component exposed to the ions of a sapphire material. During the ion-implantation process, the material positioned between the exterior surface and the ion-implanted layer may be compositionally altered when the ions pass through. For example, the lattice of the sapphire material may be broken, which may disrupt the crystalline structure of the material and/or may result in surface defects being formed in the portion of the sapphire component exposed to the ions. Additionally, the bombardment of ions creates cracks, breaks and/or other surface defects within the portion of the sapphire component exposed to the ions (e.g., the top layer). This material alteration and/or the formation of surface defects within the top layer may structurally and/or may physically weaken the sapphire component, and may degrade the optical characteristics (transparency, reflectivity, conductivity and so on) of the sapphire component. By annealing this materially altered portion, the portion of the sapphire structure positioned between the exterior surface and the ion-implanted layer may be restored to a substantially uniform crystalline state of the sapphire material, and as such may include the desirable physical properties associated with sapphire material, such as, hardness, scratch-resistance, optical transparency, and so on. Additionally, annealing the top layer exposed to ion-implantation heals the surface defects formed in the top layer and/or seals cracks formed therein to create a smooth, planar exterior surface for the sapphire component.

Additionally, the anti-reflective properties for the sapphire component may not be altered when the top, annealed layer of the sapphire component is scratched and/or cracked. Thus, the ion-implanted layer formed within the sapphire component may provide the sapphire component with improved anti-reflective properties. Because the ion-implanted layer is formed below the exterior surface of the sapphire component, the anti-reflective properties of the sapphire component cannot be altered or removed unless the ion-implanted layer is also altered or removed. As a result, the scratches and/or cracks formed within the top, annealed layer do not negatively impact, alter and/or change the improved anti-reflective properties of the sapphire component.

These and other embodiments are discussed below with reference to FIGS. 1-9. However, those skilled in the art will readily appreciate that the detailed description given herein with respect to these Figures is for explanatory purposes only and should not be construed as limiting.

FIG. 1A shows an isometric view of a sapphire component. Sapphire component 100, is shown in FIG. 1A as a sheet, but may take the form of any preform structure of sapphire material, for example, a wafer. As discussed herein, sapphire component 100 may take the form of a variety of components. In a non-limiting example, and as discussed herein, sapphire component 100 may be a cover positioned over a display of an electronic device (see, FIG. 9). Sapphire component 100 can be a single component that is in a final shape prior to undergoing the processes discussed herein or, alternatively, is a larger sheet of material that will undergo suitable shaping processes subsequent to undergoing the processes discussed herein.

Figure 1B:
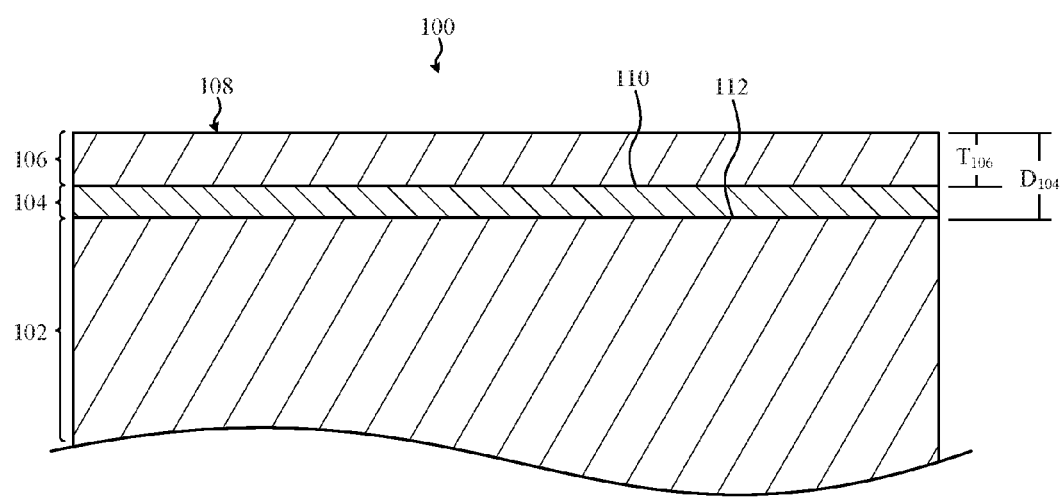
FIG. 1B shows a side cross section view of the sapphire component of FIG. 1A taken along line 1B-1B having an ion-implanted layer and a top, annealed layer, according to embodiments.

FIG. 1B illustrates a side cross-section view of sapphire component 100 of FIG. 1A taken along line 1B-1B. Sapphire component 100 has an ion-implanted layer and a top, annealed layer, according to some embodiments. As discussed herein, the various layers of sapphire component 100 include lower indexes of refraction than untreated sapphire material which results in improved anti-reflective (AR) properties for sapphire component 100. The layers of sapphire component 100 also provide sapphire component 100 with the desired physical properties (e.g., strength, hardness and so on) associated with sapphire material.

Sapphire component 100, as shown in FIG. 1B, may be a piece of artificially grown or naturally occurring corundum, commonly referred to as sapphire, that may be processed to form the ion-implanted layer, and the top, annealed layer, and subsequently used in an electronic device, as discussed herein. The grown corundum used to form sapphire component 100 may be grown using any conventional growth process including, but not limited to: hydrothermal growth; vertical horizontal gradient freezing ("VHGF"); edge-defined film-fed growth ("EFG"); horizontal moving growth (e.g., Bridgman growth); and Kyropoulos growth.

Generally, sapphire (e.g., corundum) is an anisotropic material and/or includes anisotropic properties. As a result, the crystallographic orientation of the surfaces of components made from sapphire (e.g., sapphire component 100) may affect the physical properties and/or material characteristics (including strength, ductility, and/or elasticity) of the component. The crystallographic orientation of the various surfaces may be dependent on the growing processes used for creating sapphire material forming sapphire component 100 and/or the additional processes (e.g., ion-implantation, annealing) used to form sapphire component 100. For example, the sapphire from which sapphire component 100 is formed may be grown using an EFG growth process. In the growth process, the seed crystal may include a plane (e.g., M-plane) orientation to yield sapphire that may allow for specific, desired planes to be utilized in components formed from the sapphire material. By knowing the orientation of the seed crystal used in the EFG growth process and ultimately knowing the crystallographic orientation of the grown sapphire material, manufacturers can cut the sapphire material in a specific direction to form sapphire component 100 with surfaces having specific crystallographic plane orientations or substantially desirable crystallographic plane orientations.

Knowing the specific plane crystallographic orientation for sapphire component 100 may be important when performing additional processes on sapphire component 100. Because each plane orientation for sapphire material includes distinct physical characteristics, the operational parameters for the processes performed on the sapphire material may vary dependent on the plane orientation of the sapphire material. In non-limiting examples, the operational parameters for implanting ions within and/or annealing a portion of sapphire component 100 may directly depend on the crystallographic plane orientations of the sapphire material forming sapphire component 100.

As shown in FIG. 1B, sapphire component 100 may include an unaffected or unaltered interior layer 102 positioned adjacent to and/or internally from ion-implanted layer 104 and top, annealed layer 106, where ion-implanted layer 104 separates unaltered interior layer 102 and top, annealed layer 106. Additionally, unaltered interior layer 102 may be positioned opposite exterior surface 108 of sapphire component 100 to form a body or internal portion of sapphire component 100. As discussed herein, unaltered interior layer 102 may include a portion of sapphire component 100 that remains substantially unaffected, unaltered and/or unchanged by the processes performed on sapphire component 100 to form ion-implanted layer 104 and top, annealed layer 106. As such, it is understood that the material composition of unaltered interior layer 102 of sapphire component 100 is sapphire material and may remain sapphire material during the processing of sapphire component 100, as discussed herein.

As shown in FIG. 1B, sapphire component 100 may also include ion-implanted layer 104 positioned between unaltered interior layer 102 and top, annealed layer 106. Ion-implanted layer 104 may include optical characteristics distinct from unaltered interior layer 102 and annealed layer 106, respectively. In non-limiting examples, the distinct optical characteristics of ion-implanted layer 104 may include, but are not limited to, an index of refraction that is distinct or different from the index of refraction for top, annealed layer 106 and/or unaltered interior layer 102.

The distinct optical characteristics of ion-implanted layer 104 may ultimately affect the optical properties of sapphire component 100, including, but not limited to, reducing the reflective properties and/or characteristics of sapphire component 100 and/or providing sapphire component 100 with anti-reflective (AR) properties. The reduction in the reflective properties and/or providing sapphire component 100 with AR properties is achieved in a variety of ways. In a non-limiting example, and as discussed herein, the index of refraction for ion-implanted layer 104 is lower than the index of refraction for top, annealed layer 106 and/or interior layer 102 of sapphire component 100. As a result, the overall index of refraction for sapphire component 100 is the average index of refraction for the various layers (e.g., top, annealed layer 106, ion-implanted layer 104, and so on) forming sapphire component 100. As a result of ion-implanted layer 104 having an index of refraction lower than that of sapphire material, which is the material composition of top, annealed layer 106 and interior layer 102, light pass through sapphire component 100 with a reduction in reflection of light.

In another non-limiting example, ion-implanted layer 104 absorbs distributes, disperses and/or dissipates the light passing through sapphire component 100. In some implementations, light pass through top, annealed layer 106 of the sapphire component 100 to the ion-implanted layer 104 and subsequently to interior layer 102. Once the light passes into ion-implanted layer 104 and/or the light is reflected back toward ion-implanted layer 104, the light is dispersed, distributed and/or dissipated throughout sapphire component 100, and specifically ion-implanted layer 104, without reflecting through exterior surface 108. While being dispersed and reflected within sapphire component 100 and/or ion-implanted layer 104, the light is contained substantially within sapphire component 100, and/or the amount of reflective light reflecting from sapphire component 100 is substantially reduced.

In a further non-limiting example, ion-implanted layer 104 creates a phase shift in the reflective light portions exposed to sapphire component 100 to cause a destructive phase interaction and/or to attenuate the light reflecting from ion-implanted layer 104 and/or sapphire component 100. Ion-implanted layer 104 includes a particular or predetermined thickness and/or is formed a predetermined depth within sapphire component 100, as discussed herein. As such, a light passing through ion-implanted layer 104 interacts and/or creates two reflective light portions reflecting from ion-implanted layer 104. In a non-limiting example, the first reflective light portion reflects from an upper, first interface 110 of ion-implanted layer 104 and reflects toward top, annealed layer 106. A second reflective light portion reflects from a lower, second interface 112 of ion-implanted layer 104 and also reflects toward top, annealed layer 106. However, the thickness and/or depth for which ion-implanted layer 104 is formed, and the resulting distance between first interface 110 and second interface 112 of ion-implanted layer 104 creates a quarter-wavelength phase shift between the first reflected light portion and the second reflective light portion. The quarter-wavelength phase shift between the two reflective light portions cause a destructive phase interaction, which ultimately destroys both reflective light portions and/or substantially attenuates both reflective light portions as the light reflect from sapphire component 100.

Ion-implanted layer 104, as shown in FIG. 1B, may be formed within sapphire component 100 and/or positioned a predetermined depth within sapphire component 100 and/or a predetermined distance ($D_{104}$) from exterior surface 108 of sapphire component 100. The predetermined distance ($D_{104}$) for ion-implanted layer 104 may be dependent on the desired optical characteristics ion-implanted layer 104 requires to affect the optical properties (e.g., reflectivity) of sapphire component 100. In a non-limiting example discussed herein, the predetermined depth ($D_{104}$) and/or thickness for ion-implanted layer 104 may create a quarter-wavelength phase shift in the reflective light reflecting from ion-implanted layer 104, resulting in destructive phase interaction and/or attenuation of the reflective light. As discussed herein, the predetermined distance ($D_{104}$) may be based, at least in part, on the crystallographic orientation of sapphire component 100 and/or the operational and/or compositional parameters of the ion-implantation process performed on sapphire component 100 to form ion-implanted layer 104. Similar to the predetermined distance ($D_{104}$), and as discussed herein, ion-implanted layer 104 is also formed to a predetermined thickness, that also influences and/or affects the optical and/or optical properties (e.g., reflectivity) of sapphire component 100.

Sapphire component 100 may also include top, annealed layer 106. As shown in FIG. 1B, top, annealed layer 106 may be positioned proximate to unaltered interior layer 102, and may be separated from unaltered interior layer 102 by ion-implanted layer 104. Additionally, top, annealed layer 106 may form exterior surface 108 of sapphire component 100. Top, annealed layer 106 may be formed within sapphire component 100 at a predetermined depth and/or may include a predetermined thickness ($T_{106}$). In non-limiting examples, the predetermined thickness ($T_{106}$) of top, annealed layer 106 may be less than approximately 1 micron (μm), and more specifically, may be between approximately 200 nanometers (nm) and approximately 900 nm. As discussed herein, the predetermined thickness ($T_{106}$) of top, annealed layer 106 may be based on the type of annealing process performed on sapphire component 100, the operational parameters of the annealing process performed on sapphire component 100, and/or the predetermined distance ($D_{104}$) ion-implanted layer 104 is positioned and/or spaced apart from exterior surface 108 of sapphire component 100.

As discussed herein, top, annealed layer 106 may undergo an annealing process subsequent to the ion-implantation process performed on sapphire component 100. The annealing process anneals the portion of sapphire component 100 positioned above ion-implanted layer 104 that may be materially and/or compositionally altered during the ion-implantation process. As a result of the annealing process, top, annealed layer 106 of sapphire component 100 may be materially and/or compositionally similar to unaltered interior layer 102. In a non-limiting example, top, annealed layer 106 may be formed from sapphire material, similar to the sapphire material forming unaltered interior layer 102.

The annealing of top, annealed layer 106 may heal, reflow, rework and/or restore the portion (e.g., top, annealed layer 106) of sapphire component 100 positioned adjacent ion-implanted layer 104 that may be exposed to and/or damaged during the ion-implantation process. When sapphire component 100 is bombarded with ions to form ion-implanted layer 104, the portion of sapphire component 100 that the ions pass through to form ion-implanted layer 104 may be damaged (e.g. surface defects) and/or materially/compositionally altered. For example, the ions passing through the portion of sapphire component 100 positioned adjacent ion-implanted layer 104 may destroy and/or alter the lattice structure of the sapphire material forming top layer 106 of sapphire component 100. In a non-limiting example, the disruption of the crystalline structure can cause top layer 106 of sapphire structure 100 to be an amorphous material. Additionally, the ions passing through top layer 106 may form surface defects, such as cracks, chips and/or breaks in sapphire component 100. Performing the annealing process forms top, annealed layer 106 to have similar material and/or compositional properties or characteristics as unaltered interior layer 102 (e.g., sapphire material). Additionally, the annealing process may heal all surface defects and/or fill any cracks formed in top layer 106 during the ion-implantation process. As a result, the exterior surface of sapphire component 100 formed by top, annealed layer 106 may include all the positive and/or beneficial physical, chemical and/or transparent characteristics associated with sapphire material. Annealing top, annealed layer 106 of sapphire component 100, top, annealed layer 106 may be restored to its original material composition of sapphire and, with that, the strength, optical clarity, and surface finish of top, annealed layer 106 may also be restored.

Figure 2:
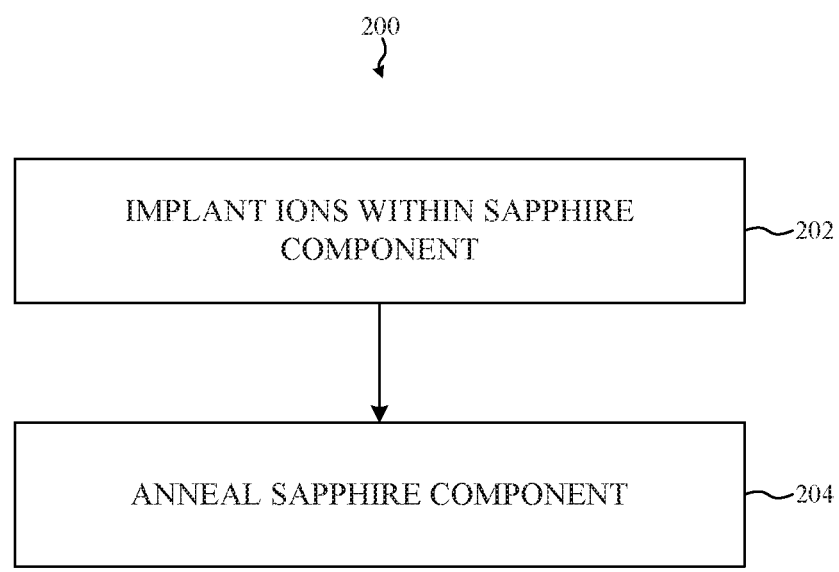
FIG. 2 shows a flow chart of an example process for forming an ion-implanted layer within a sapphire component, according to embodiments.

FIG. 2 depicts an example process 200 for forming an ion-implanted coating within a sapphire material or structure. This process may be used to form one of the various embodiments as discussed above with respect to FIGS. 1, and 3A-7.

In operation 202, ions are implanted and/or embedded below an exterior surface of a sapphire material to form an ion layer. Ions are implanted within the sapphire material by providing accelerated ions to the sapphire material to achieve ion diffusion within the sapphire. Implanting ions within the sapphire material also includes providing accelerated ions to the sapphire material to achieve phase segregation within the sapphire component. The implantation of the ions within the sapphire material may be performed over the entire sapphire material, or may be implanted locally. In some instances, the entire sapphire material may undergo an ion-implantation process, or alternatively, only a select or local portion of the sapphire material can be implanted with ions, where only the select or local portion of the sapphire material requires an alteration in the optical properties and/or characteristics (e.g., improved anti-reflective properties), as discussed herein.

The ion layer is formed a first, predetermined depth within the sapphire material, and/or a predetermined distance away from the exterior surface of the sapphire material. The composition of the ions and/or operational parameters of the ion-implantation process affect the depth in which the ion layer is formed within the sapphire material. The predetermined distance is based, at least in part, on the crystallographic orientation of the sapphire material and/or the operational and/or compositional parameters of the ion-implantation process performed in operation 202 on the sapphire material.

Additionally, the ion layer has a first index of refraction that is different than a second index of refraction of the sapphire material. In a non-limiting example, the first index of refraction for the ion layer is lower than the second index of refraction for the remaining portions of the sapphire material. As discussed herein, the difference in the index of refraction for the ion layer may aid or contribute in improving the anti-reflective (AR) properties of the sapphire material.

The implanting of the ions within the sapphire material also includes ion-implanting a first group of ions within the sapphire material to form a first section of the ion layer, and ion-implanting a second group of ions within the sapphire material to form a second section of the ion layer. The second group of ions may be positioned adjacent the first group. In non-limiting examples, the first group of ions is positioned in a distinct layer above and/or below the second group of ions, or alternatively, the second group of ions is formed in the same layer as the first group of ions and is substantially encircled or surrounded within the same layer by the first group of ions. The second group of ions may be compositionally distinct, and/or may be applied to the sapphire material using distinct operational parameters. As such, the second section of the ion layer may be material distinct from the first section and, as a result, may include distinct reflective properties.

In response to implanting ions in operation 202, a top, altered layer is formed within the sapphire material. The top, altered layer is formed adjacent the ion-implanted layer, and is separated from the unaltered interior layer of the sapphire material by the ion-implanted layer. Additionally, the top, altered layer forms the exterior surface of the sapphire material. The top, altered layer formed within the sapphire material as a result of implanting ions within sapphire material includes altered material and/or compositions when compared to the remaining portions of the sapphire material. Specifically, the ions passing through the sapphire material to form the ion-implanted layer form surface defects, such as cracks, chips and/or breaks in the altered layer of the sapphire material. As a result, the top, altered layer exposed to the ions may resemble an amorphous material having surface defects subsequent to the ion implantation process performed in operation 202.

In operation 204, the exterior surface of the sapphire material is annealed. The exterior surface and at least a portion of the top, altered layer of the sapphire material is annealed. Annealing the exterior surface and/or the top, altered layer of the sapphire material results in the formation of a top, annealed layer positioned adjacent the ion-implanted layer. This annealing process of operation 204, which results in the formation of the top, annealed layer also includes the formation of the sapphire component having the anti-reflective layer, as discussed herein. That is, the process of annealing the top, altered layer formed in the sapphire material to form top, annealed layer includes forming the sapphire component having the anti-reflective layer.

The annealing of the exterior surface and/or the top, altered layer to form the top, annealed layer may also include altering the material and/or compositional characteristics or properties of the top, altered layer to be substantially similar to the material and/or compositional characteristics or properties of the unaltered interior layer of the now formed sapphire component. The annealing process may change or restore the top, altered layer from a layer of material having a damaged crystalline structure back to the uniform crystalline sapphire material, similar to the sapphire component prior to ion-implantation. As a result, the top, annealed layer of the sapphire material forms the exterior surface of the sapphire component, and includes a material (e.g., sapphire) similar to the unaltered interior layer of the sapphire component.

Additionally, the annealing process heals any surface defects or cracks forming in the top, altered layer during ion-implantation, as well as smooths the exterior surface. As discussed above, the reworking and/or reflowing of the material forming the top, annealed layer during the annealing process substantially fills and heals all surface defects formed in the sapphire component during the ion-implantation process performed in operation 202. Additionally as a result of reworking and/or reflowing the material during the annealing process, the exterior surface of the sapphire component is also substantially made smooth and/or planar during the annealing process of operation 204.

The exterior surface and/or the top, altered layer of the sapphire component may be annealed to a second, predetermined depth within the sapphire component. The second predetermined depth in which the exterior surface of the sapphire component is annealed also determines the thickness for the top, annealed layer. The second depth may be distinct from or substantially equal to the first predetermined depth for which ions are implanted within the sapphire component during operation 202. In a non-limiting example, the annealing of the top, altered layer may include annealing down a second depth substantially equal to the first, predetermined depth of ion-implantation, such that the entire altered layer of the sapphire component is annealed to form the top, annealed layer. In the non-limiting example, the sapphire component includes the top, annealed layer forming the exterior surface of the sapphire component, the ion-implanted layer positioned adjacent the top, annealed layer, and the unaltered interior layer positioned adjacent to the ion-implanted layer, opposite the top, annealed layer. The entire top, altered layer is annealed to transform the top, altered layer into the top, annealed layer.

In another non-limiting example, the annealing of the top, altered layer may include annealing down a second depth substantially greater than the first, predetermined depth of ion-implantation, such that the entire top, altered layer of the sapphire component forms the top, annealed layer and anneals a portion of the ion-implanted layer of the sapphire component. The top, annealed layer of the ion-implanted layer of the sapphire component may be considered a transition portion of the sapphire component that is both annealed and includes implanted ions. In the non-limiting example, the sapphire component includes the top, annealed layer forming the exterior surface of the sapphire component, the transition portion positioned between the annealed layer and the ion-implanted layer, the ion-implanted layer and the unaltered interior layer positioned adjacent to the ion-implanted layer, opposite the top, annealed layer.

In an additional non-limiting example, the annealing of the altered portion may include annealing down a second depth substantially less than the first, predetermined depth of ion-implantation, such that only a portion of the top, altered layer of the sapphire component forms the top, annealed layer. As a result of only annealing a portion of the altered layer of the sapphire component, the sapphire component may include an unannealed portion of the top, altered layer which may be positioned between the top, annealed layer and the ion-implanted layer. The chemical and/or compositional properties of the unannealed portion of the top, altered layer may not be altered by the annealing process and, as such, may remain the same after the ion-implantation process is performed on the sapphire component. In the non-limiting example, the sapphire component includes the top, annealed layer forming the exterior surface of the sapphire component, the unannealed portion of the top, altered layer positioned between the top, annealed layer and the ion-implanted layer, and the unaltered interior layer positioned adjacent to the ion-implanted layer, opposite the top, annealed layer.

In a further non-limiting example, the entire sapphire component can undergo an annealing process. In the non-limiting example, the top, altered layer, the ion-implanted layer and the unaltered interior layer forming the sapphire component may undergo an annealing process. In the non-limiting example, the top, altered layer is converted to the top, annealed layer as similarly discussed herein. Specifically, the entire top, altered layer formed as a result of performing the ion-implantation process on the sapphire component is annealed to form the top, annealed layer. Additionally, the ion-implanted layer and unaltered interior layer may experience the annealing process, and as a result may undergo similar effects as discussed herein. For example, internal cracks or breaks formed in the ion-implanted layer and/or the unaltered interior layer as a result of the ion-implantation process in operation 202 may be healed and/or filled.

Any suitable annealing technique and/or annealing device can be used to perform the annealing process in operation 204. In a non-limiting example where only the top, altered layer of the sapphire component undergoes the annealing process to form the top, annealed layer, the sapphire component experiences local or regional annealing using a suitable annealing device to achieve local annealing. In the non-limiting example, the local or regional annealing can be achieved by exposing the sapphire component to a laser annealing system, a flame annealing system or a flash-lamp annealing system for selectively annealing the top, altered layer of the sapphire component. In another non-limiting example where the entire sapphire component is annealed, the sapphire component can be inserted into an oven or furnace for heating the entire component. In either non-limiting example, the annealing process and/or the annealing device used to anneal the sapphire component anneals a minimal thickness and/or anneals down a minimal depth within the sapphire component to heal the defects and/or anneal the sapphire component without causing warpage and/or distortion within the sapphire component.

The formation of the ion-implanted layer in operation 202, and the subsequent annealing in operation 204, improves the anti-reflective (AR) properties in the exterior surface, the top, annealed layer and/or the ion-implanted layer of the sapphire component. The change in the index of refraction in the ion-implanted layer of the sapphire component may result in a change, and specifically a lowering, of the overall index of refraction of the sapphire component. As a result, the AR properties of the sapphire component are improved over untreated and/or unaffected sapphire material. Additionally, and as discussed herein, the ion-implanted layer can also create a phase shift within reflected light reflecting from the sapphire component and/or can absorb light passing through the sapphire component to also improve AR properties for the sapphire component.

Although shown and discussed as only being performed a single time, it is understood that the ion-implantation process performed in operation 202 and/or the annealing process performed in operation 204 can be performed more than once to form multiple ion-implanted layers and/or annealed layers within the sapphire component. In a non-limiting example, the sapphire component undergoes a first ion-implantation process, similar to operation 202, to form a first ion-implanted layer within the sapphire component. Portions of the sapphire component formed between the first ion-implanted layer and the exterior surface are materially and/or compositionally altered due to the ion-implantation, as discussed herein. Subsequent to forming the first ion-implanted layer, an intermediate annealed layer is formed within the sapphire component between the first ion-implanted layer and the exterior surface of the sapphire component. The intermediate annealed layer is formed using an annealing process similar to operation 204. Next in the non-limiting example, the sapphire component undergoes a second ion-implantation process similar to operation 202 to form the second ion-implanted layer. In addition to forming the second ion-implanted layer, the second ion-implantation process may form and/or define the intermediate annealed layer positioned between the first ion-implanted layer and the second ion-implanted layer. Finally, the sapphire component undergoes a second annealing process similar to operation 204 to form a top, annealed layer adjacent the second ion-implanted layer. As similarly discussed herein, the top, annealed layer formed during the second annealing process also forms the exterior surface of the sapphire component.

Figure 3A:
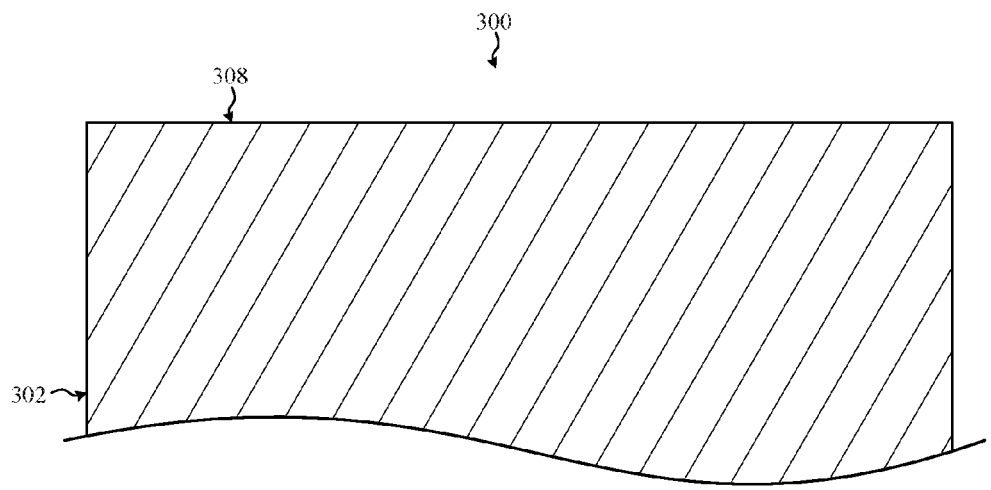
FIGS. 3A-3C show a side view of a sapphire component undergoing a process for forming an ion-implanted layer within the sapphire component, as shown in FIG. 2, according to embodiments.
Figure 3B:
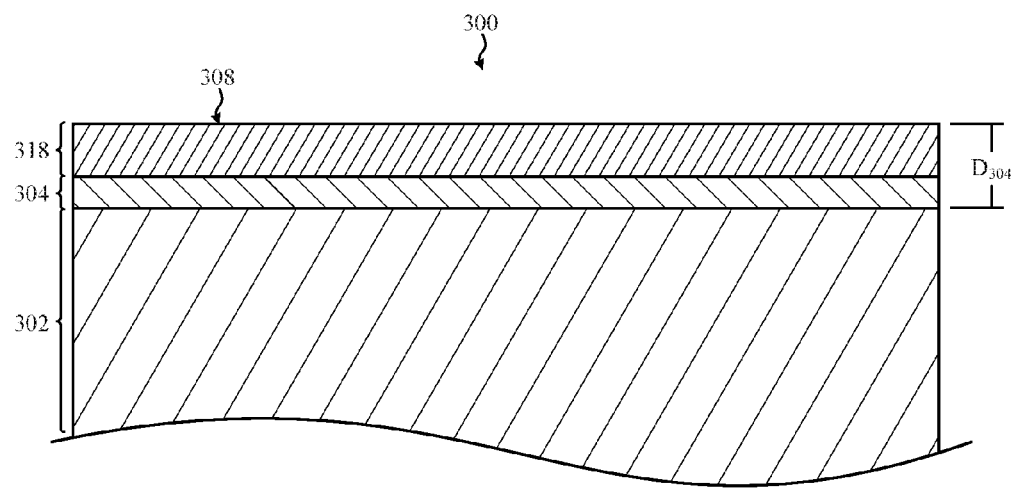
Figure 3C:
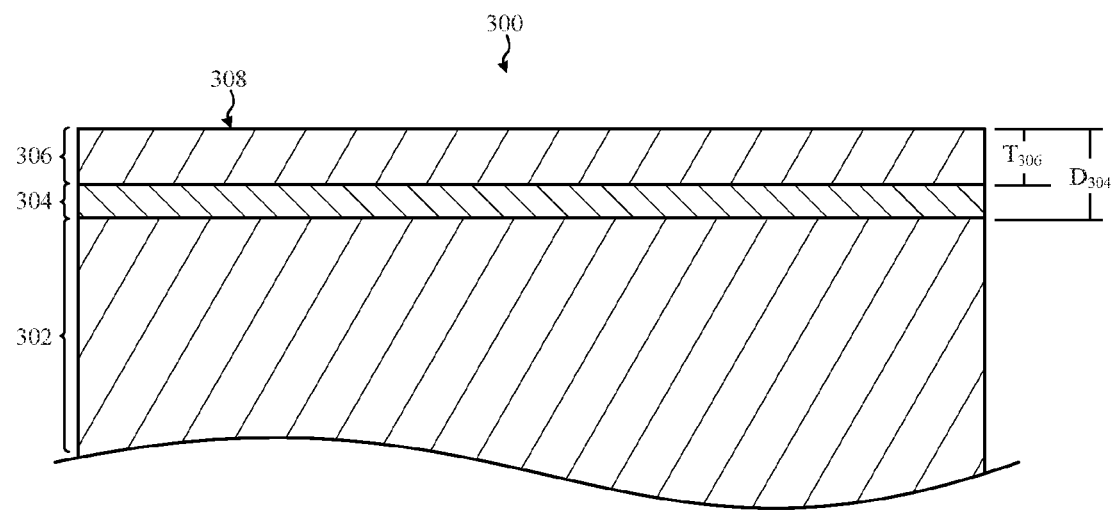

FIGS. 3A-3C show a side view of a sapphire material undergoing the example process 200 for forming an ion-implanted, anti-reflective coating within a sapphire component 300 (see, FIG. 3C) as discussed herein with respect to FIG. 2. It is understood that similarly numbered and/or named components may function in a substantially similar fashion. Redundant explanation of these components has been omitted for clarity.

FIG. 3A shows a side cross-section view of a sapphire material 301 prior to being processed. Sapphire material 301 may have an exterior surface 308 and an interior layer 302 positioned adjacent exterior surface 308. In a non-limiting example, sapphire material 301 may be prepared to undergo an ion-implantation process and an annealing process, similar to operations 202 and 204, respectively. Prior to performing the ion-implantation process and annealing process on sapphire material 301, and as shown in FIG. 3A, the material and/or compositional properties of sapphire material 301 may be uniform throughout. The material and/or compositional properties of the interior layer 302 may be substantially identical to the material and/or compositional properties of sapphire material 301 at exterior surface 308.

FIG. 3B shows a side cross-section view of sapphire material 301 subsequent to performing an ion-implantation process, similar to that of the ion-implantation process of operation 202. The ion-implantation process may be performed on sapphire material 301 in order to form ion-implanted layer 304 within sapphire material 301. The ion-implantation process may provide additional energy to the exterior surface 308 of sapphire material 301 via the ions in order to achieve ion diffusion and/or phase segregation within sapphire material 301. Ions may be directed toward and through exterior surface 308 to be implanted within sapphire material 301 to form ion-implanted layer 304. This implantation of ions resulting in ion diffusion and/or phase segregation of ion-implanted layer 304 of sapphire material 301 may form a portion (e.g., ion-implanted portion) of sapphire material 301 having distinct optical characteristics when compared to interior layer 302. In non-limiting examples, the distinct optical characteristics of ion-implanted layer 304 may include, but are not limited to, a distinct index of refraction. As discussed herein, forming ion-implanted layer 304 with a distinct index of refraction improves the anti-reflective (AR) properties of the sapphire component by lowering the overall index of refraction of sapphire material 301, providing a layer capable of creating a wavelength phase shift for reflective light and/or providing a layer that absorbs, disperses and/or dissipates light emitted through sapphire material 301.

As shown in FIG. 3B, ion-implanted layer 304 may be formed within sapphire material 301 and/or positioned a first, predetermined depth or distance ($D_{304}$) from exterior surface 308 of sapphire material 301. The predetermined depth or distance ($D_{304}$) for ion-implanted layer 304 may be dependent on the desired optical characteristics ion-implanted layer 304 requires to affect the optical properties (e.g., reflectivity) of sapphire material 301. Additionally, the predetermined depth or distance ($D_{304}$) for ion-implanted layer 304 may be determined by the operational and/or compositional parameters of the ion-implantation process performed on sapphire material 301. In a non-limiting example, the energy level, the acceleration and/or the temperature of the ions used in the ion-implantation process may determine the depth or distance ($D_{304}$) in which ion-implanted layer 304 is formed within sapphire material 301. In another non-limiting example, the composition of each ion (e.g., nitrogen, silicon, aluminum, carbon, magnesium), which may be implanted or embedded through and/or within sapphire material 301 to form ion-implanted layer 304, may determine the depth or distance ($D_{304}$) of ion-implanted layer 304.

The predetermined depth or distance ($D_{304}$) in which ion-implanted layer 304 may be formed in sapphire material 301 may be a desired or optimal depth for providing sapphire material 301 with improved optical characteristics and/or lowering the index of refraction of sapphire material 301. In a non-limiting example, predetermined depth or distance ($D_{304}$) may be the desired depth for providing sapphire material 301 with optimal anti-reflective (AR) characteristics, while also maintaining enough sapphire material above ion-implanted layer 304 (see, annealed layer 306; FIG. 3C) to protect sapphire material 301, as discussed herein. The predetermined depth or distance ($D_{304}$) of ion-implanted layer 304 may be dependent, at least in part, on the overall dimensions (e.g., thickness, width) of sapphire material 301, the purpose or utilization of sapphire material 301 within an electronic device, the formation of additional materials or layers on exterior surface 308 of sapphire material 301, and so on.

The operational and/or compositional parameters of the ion-implantation process performed on sapphire material 301 may affect sapphire material 301 in a variety of other ways as well. In a non-limiting example, the operational and/or compositional parameters of the ion-implantation process performed on sapphire material 301 may affect and/or determine the chemical or material composition of ion-implanted layer 304 and/or altered layer 318 of sapphire material 301, as discussed herein. In another non-limiting example, and in conjunction with the predetermined depth or distance ($D_{304}$) in which ion-implanted layer 304 is formed within sapphire material 301, the operational and/or compositional parameters of the ion-implantation process may affect the optical characteristics of ion-implanted layer 304.

Additionally, the crystallographic plane orientation of the sapphire material forming sapphire material 301 may affect and/or influence sapphire material 301 and/or ion-implanted layer 304. In a non-limiting example, operational and/or compositional parameters of the ion-implantation process performed on sapphire material 301 may be based, at least in part, on the crystallographic plane orientation of sapphire material 301. For example, where sapphire material 301 and/or exterior surface 308 are formed with an M-plane crystallographic orientation, which is associated with improved hardness for sapphire material 301, the acceleration of the ions may be greater than the acceleration of the ions being implanted in a sapphire material having a different crystallographic orientation. In another non-limiting example, and distinct from or taken in conjunction with the influence on the operational and/or compositional parameters of the ion-implantation process, the crystallographic plane orientation of sapphire material 301 may affect or influence the optical characteristics of ion-implanted layer 304 formed in sapphire material 301. For example, C-plane sapphire material may be the least reflective crystallographic orientation for sapphire material.

As shown in FIG. 3B, performing the ion-implantation process on sapphire material 301 may result in the formation of top, altered layer 318. Altered layer 318 may be formed between ion-implanted layer 304 and exterior surface 308 of sapphire material 301 as a result of ions passing through sapphire material 301 at exterior surface 308. The material and/or compositional characteristics or properties of top, altered layer 318 may be altered and/or different from material and/or compositional characteristics or properties of ion-implanted layer 304 and interior layer 302 of sapphire material 301. In a non-limiting example, the ions passing through altered layer 318 of sapphire material 301 to form ion-implanted layer 304 may alter and/or destroy the lattice structure of the sapphire material forming sapphire material 301, which may result in the altering or changing of the material and/or compositional characteristics or properties of altered layer 318. This may also result in top, altered layer 318 no longer having a crystalline material structure, but rather, top, altered layer 318 is an amorphous material after performing the ion-implantation process.

The processes performed on sapphire material 301 as shown and discussed herein with respect to FIG. 3B may correspond to operation 202 of the process 200 shown in FIG. 2.

FIG. 3C shows a side cross-section view of sapphire component 300 subsequent to performing an annealing process on sapphire material 301 (see, FIG. 3B). The annealing process performed on sapphire material 301, which corresponds to operation 204, may anneal at least a portion of top, altered layer 318 (FIG. 3B) to form top, annealed layer 306 within sapphire material 301. Top, annealed layer 306 may form exterior surface 308 and may be formed between exterior surface 308 of sapphire material 301 and ion-implanted layer 304. The annealing process may be performed on sapphire material 301 using any suitable annealing technique that may selectively anneal portions of a material. In non-limiting examples, sapphire material 301 may be exposed to a laser or a flash-lamp for selectively annealing at least a portion of altered layer 318 of sapphire component 300 to form annealed layer 306.

The formation of top, annealed layer 306 also forms sapphire component 300, and/or transforms sapphire material 301 (see, FIG. 3B) to sapphire component 300 having an ion-implanted, anti-reflective layer as discussed herein. As such, FIG. 3C refers to the previously discussed sapphire material 301 as sapphire component 300.

Top, annealed layer 306 may be formed from at least a portion of altered layer 318 of sapphire component 300. In a non-limiting example shown in FIG. 3C, and with comparison to FIG. 3B, the entirety of altered layer 318 may be annealed to form annealed layer 306 in sapphire component 300. Annealed layer 306 may also have a predetermined thickness ($T_{306}$) and/or may be formed from a predetermined depth within sapphire component 300. In the non-limiting example shown in FIG. 3C, the predetermined thickness ($T_{306}$) of top, annealed layer 306 may be the dimension or area between exterior surface 308 of sapphire component 300 and ion-implanted layer 304, such that top, annealed layer 306 may substantially end where ion-implanted layer 304 begins. In additional non-limiting examples discussed herein, only a portion of altered layer 318 may be annealed, or alternatively, all of altered layer 318 and a portion of ion implanted layer 304 may be annealed when forming annealed layer 306. The thickness ($T_{306}$) of annealed layer 306 may be dependent, at least in part, on the annealing technique used to form annealed layer 306 and/or the operational parameters of the annealing process. In non-limiting examples, the operational parameters may include, but are not limited to, the melting temperature of altered layer 318 and/or sapphire material 301, the melting speed of altered layer 318 and/or sapphire material 301, the exposure time for sapphire material 301, and/or the dosage level of the annealing device (e.g., laser, flash-lamp, and so on) used to anneal sapphire component 300.

As a result of annealing altered layer 318 to form annealed layer 306, the material and/or compositional characteristics or properties of altered layer 318 may be changed to be substantially similar to the material and/or compositional characteristics or properties of the interior layer 302 of sapphire component 300. The process of annealing altered layer 318 of sapphire component 300 may refurbish, reflow, rework and/or restore altered layer 318 to an annealed layer 306 made of sapphire material substantially similar to interior layer 302 and/or the original material composition of sapphire component 300. As such, annealed layer 306 of sapphire component 300 forming exterior surface 308 of sapphire component 300 includes a material (e.g., sapphire) similar to interior layer 302 of sapphire component 300.

The processes performed on sapphire material 301 as shown and discussed herein with respect to FIG. 3C, may correspond to operation 204 of the process 200 shown in FIG. 2.

By annealing sapphire material 301 (see, FIG. 3B) to form annealed layer 306 formed from sapphire material, sapphire component 300 may have exterior surface 308 that has all of the physical, structural and/or compositional benefits of sapphire material. In a non-limiting example, annealed layer 306 forming exterior surface 308 may have the desired and physically beneficial hardness of sapphire material, which ultimately improves the strength and hardness of sapphire component 300. In a non-limiting example, sapphire component 300 may be scratch resistant on exterior surface 308 as a result of annealed layer 306 being formed from sapphire material.

Additionally, top, annealed layer 306 may also include the reflective characteristics of interior layer 302 and/or sapphire material. However, because annealed layer 306 is positioned directly adjacent to ion-implanted layer 304, which includes distinct optical characteristics (e.g., anti-reflective characteristics, reduced indexes of refraction), the overall reflective characteristic of sapphire component 300 may be reduced. As discussed herein, ion-implanted layer 304, having distinct optical characteristics that relate to reducing reflective characteristics, may reduce the overall reflectiveness of annealed layer 306, interior layer 302 and/or sapphire component 300. In a non-limiting example, the reflective characteristics of the annealed layer 306 and ion-implanted layer 304 may be averaged to determine the reflective properties of sapphire component 300. Because top, annealed layer 306 is formed from sapphire material and ion-implanted layer 304 has reflective characteristics lower than sapphire material, the average of the reflective characteristics of top, annealed layer 306 and ion-implanted layer 304 may also be lower than sapphire material. As a result, sapphire component 300 may have all of the physical benefits of sapphire material, while also having reflective characteristics lower than just sapphire material.

Figure 4:
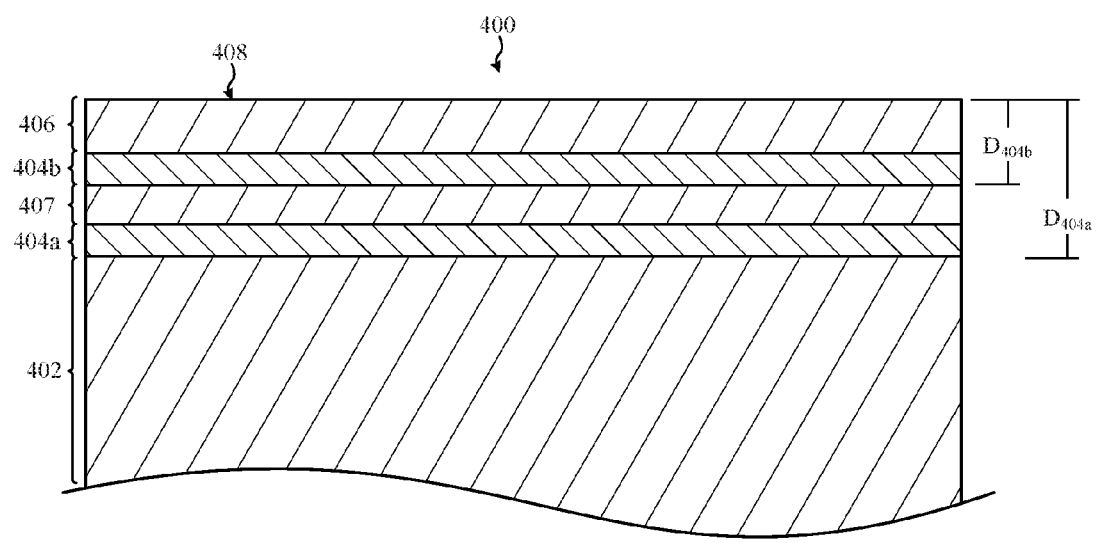
FIG. 4 shows a side view of a sapphire component having a group of ion-implanted layers and a group of annealed layers, according to embodiments.

FIG. 4 shows a side cross-section view of a sapphire component 400 having two distinct ion-implanted layers 404a, 404b and two distinct annealed layers 406, 407. It is understood that similarly numbered and/or named components may function in a substantially similar fashion. Redundant explanation of these components has been omitted for clarity.

Sapphire component 400 includes a first ion-implanted layer 404a positioned directly adjacent unaltered interior layer 402, and a second ion-implanted layer 404b positioned adjacent first ion-implanted layer 404a. As shown in FIG. 4, first ion-implanted layer 404a may be positioned closest to unaltered interior layer 402, and second ion-implanted layer 404b may be positioned adjacent exterior surface 408. As similarly discussed herein, each of the two distinct ion-implanted layers 404a, 404b may be formed and/or positioned a predetermined depth or distance ($D_{404a}$, $D_{404b}$) within sapphire component 400. Specifically, first ion-implanted layer 404a may be positioned a first predetermined depth or distance ($D_{404a}$) within sapphire component 400, and second ion-implanted layer 404b may be positioned a second, distinct predetermined depth or distance ($D_{404b}$) within sapphire component 400. In a non-limiting example shown in FIG. 4, the first predetermined depth or distance ($D_{404a}$) and the second predetermined depth or distance ($D_{404b}$) may be distinct, where the first predetermined depth ($D_{404a}$) is greater than the second predetermined depth ($D_{404b}$).

In a non-limiting example shown in FIG. 4, first ion-implanted layer 404a and second ion-implanted layer 404b may be formed to have substantially the same thickness and/or may have the same material and/or compositional properties. Additionally in the non-limiting example, first ion-implanted layer 404a and second ion-implanted layer 404b may have substantially similar optical characteristics formed during the ion-implantation process, as discussed herein. However, it is understood that first ion-implanted layer 404a and second ion-implanted layer 404b may include distinct features from one another. In another non-limiting example, first ion-implanted layer 404a and second ion-implanted layer 404b may have distinct thicknesses, material and/or compositional properties and/or optical characteristics. As discussed herein, the predetermined depth or distance ($D_{404a}$, $D_{404b}$), the thickness, material and/or compositional properties and optical characteristics (e.g., index of refraction) of the two ion-implanted layers 404a, 404b of sapphire component 400 may be dependent, at least in part, on the operational and/or compositional parameters of the ion-implantation process performed on sapphire component 400. Additionally as discussed herein, first ion-implanted layer 404a and second ion-implanted layer 404b may be formed in sapphire component 400 to reduce the reflective properties of sapphire component 400.

Sapphire component 400 may also have two distinct annealed layers 406, 407. As shown in FIG. 4, intermediate, annealed layer 407 may be positioned between first ion-implanted layer 404a and second ion-implanted layer 404b, and top, annealed layer 406 may be positioned adjacent intermediate annealed layer 407. Top, annealed layer 406 may be separated from intermediate annealed layer 407 by second ion-implanted layer 404b. As shown in FIG. 4, top, annealed layer 406 may form exterior surface 408 for sapphire component 400. Although not shown, each of intermediate, annealed layer 407 and top, annealed layer 406 may be formed to have a predetermined thickness ($T_{406}$, $T_{407}$), as similarly discussed herein with respect to FIGS. 1 and 2. The predetermined thicknesses ($T_{406}$, $T_{407}$) for each of intermediate, annealed layer 407 and top, annealed layer 406 may be similar or distinct. In a non-limiting example shown in FIG. 4, a first predetermined thickness ($T_{407}$) for intermediate, annealed layer 407 may be smaller or thinner than a second predetermined thickness ($T_{406}$) for top, annealed layer 406. However, it is understood that the predetermined thicknesses ($T_{406}$, $T_{407}$) for each of intermediate, annealed layer 407 and top, annealed layer 406 may vary or be similar to improve the reflective properties and/or the physical properties of sapphire component 400. As discussed herein, the two distinct annealed layers 406, 407 of sapphire component 400 may be formed from sapphire material similar to the sapphire material forming interior layer 402. Additionally, and as discussed herein, the thickness, and material and/or compositional properties of the two annealed layers 406, 407 of sapphire component 400 may be dependent, at least in part, on the operational parameters of the annealing process performed on sapphire component 400.

Figure 5:
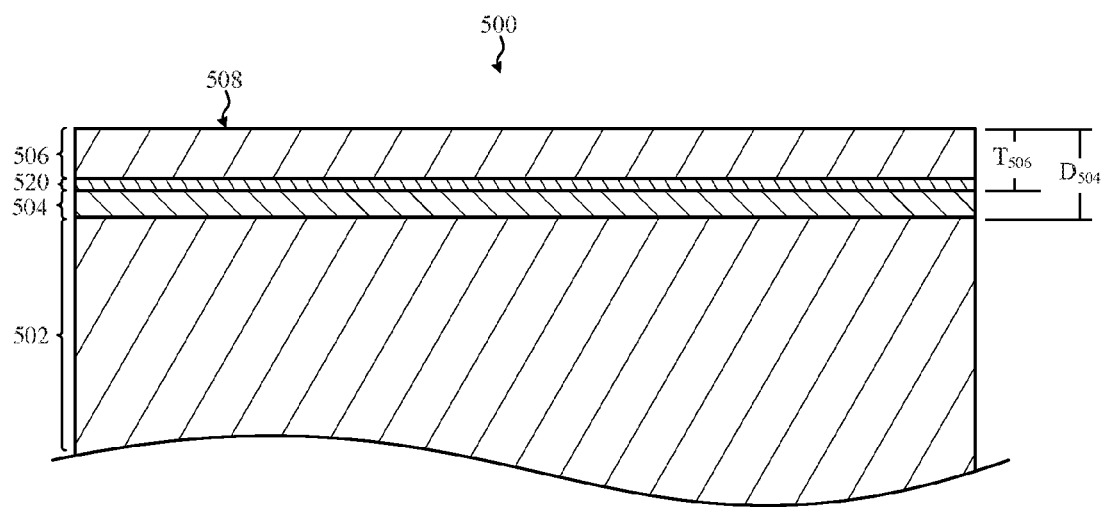
FIG. 5 shows a side view of a sapphire component having an ion-implanted layer and a top, annealed layer, according to additional embodiments.

FIG. 5 shows a side cross-section view of sapphire component 500. As discussed herein, sapphire component 500 includes interior layer 502, ion-implanted layer 504 and annealed layer 506, similar to the identically named portions of the sapphire structures discussed herein with respect to FIGS. 1 and 3A-3C. Redundant explanation of these portions of sapphire component 500 is omitted for clarity.

Sapphire component 500 may also include transition portion 520. As shown in FIG. 5, transition portion 520 may be positioned between ion-implanted layer 504 and top, annealed layer 506. Transition portion 520 may be formed from an annealed segment of ion-implanted layer 504. The transition portion 520 may be formed during the annealing process performed on sapphire component 500 to form top, annealed layer 506. During the annealing process, the predetermined depth or thickness ($T_{506}$) of top, annealed layer 506 may be greater than the depth or thickness of altered material formed between exterior surface 508 and ion-implanted layer 504. As a result, a portion of ion-implanted layer 504 may also be annealed to form transition portion 520. Transition portion 520 may have similar or distinct optical characteristics and/or material and/or compositional properties or characteristics as ion-implanted layer 504 and/or top, annealed layer 506. In a non-limiting example, the optical characteristics and the material or compositional characteristics of transition portion 520 may be distinct from the optical and material characteristics of both ion-implanted layer 504 and annealed layer 506.

Figure 6:
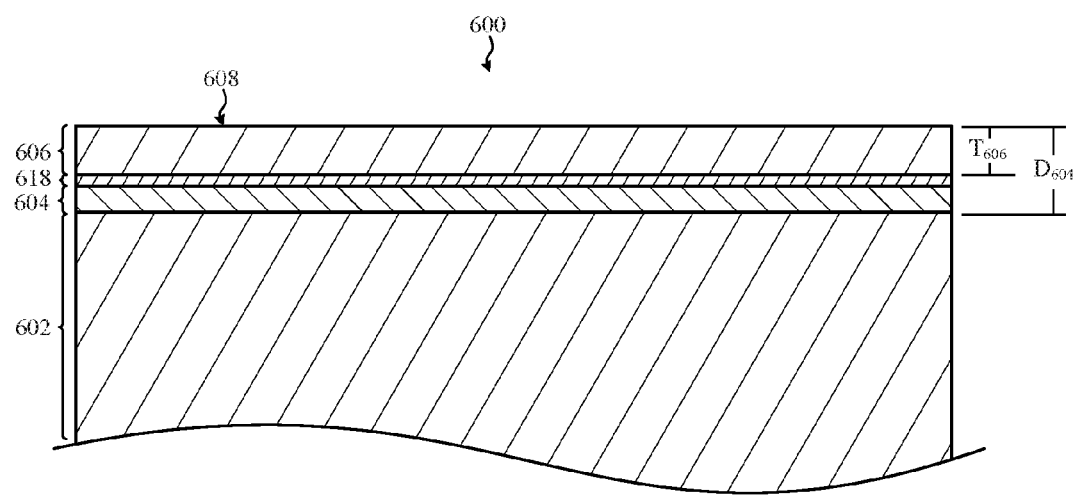
FIG. 6 shows a side view of a sapphire component having an ion-implanted layer and a top, annealed layer, according to further embodiments.

FIG. 6 shows a side cross-section view of sapphire component 600, which includes similar portions and/or features as sapphire component 500. However, distinct from sapphire component 500 of FIG. 5, sapphire component 600 does not include a transition portion 520 positioned between ion-implanted layer 604 and top, annealed layer 606. Rather as shown in FIG. 6, sapphire component 600 includes altered portion 618 positioned between ion-implanted layer 604 and top, annealed layer 606. As discussed herein, altered portion 618 may include a portion of sapphire component 600 that is exposed to and/or altered by ions passing through sapphire component 600 during the ion-implantation process. Altered portion 618 may be formed as a result of the ion-implantation process and may remain within sapphire component 600 as a result of the formation of top, annealed layer 606 during the annealing process performed on sapphire component 600. Specifically during the annealing process, the predetermined depth or thickness ($T_{606}$) of top, annealed layer 606 may be less than the depth or thickness of altered portion 618 formed between exterior surface 608 and ion-implanted layer 604. As a result, a portion of altered portion 618 may not be annealed when forming annealed layer 606 and may remain in sapphire component 600. As discussed herein, altered portion 618 may have distinct optical characteristics and/or material and/or compositional properties or characteristics from ion-implanted layer 604 and/or top, annealed layer 606.

Figure 7:
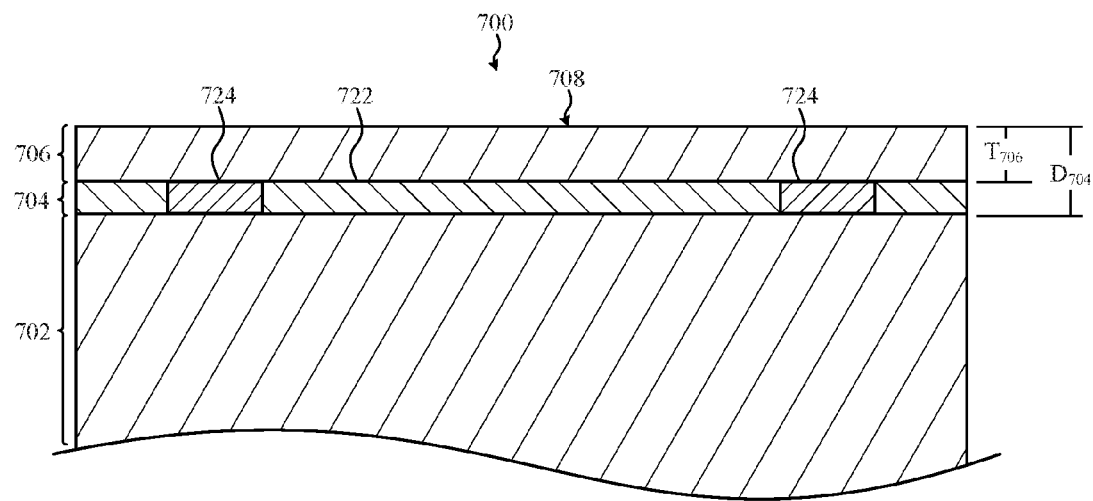
FIG. 7 shows a side view of a sapphire component having an ion-implanted layer and a top, annealed layer, according to another embodiment.

FIG. 7 shows a sapphire component 700 having distinct sections 722, 724 of ion-implanted layer 704. As shown in FIG. 7, ion-implanted layer 704 may include a first section 722 and a second section 724 positioned adjacent first section 722. First section 722 and second section 724 of ion-implanted layer 704 may be positioned between top, annealed layer 706 and interior layer 702 of sapphire component 700. The distinct sections 722, 724 of ion-implanted layer 704 may be formed by altering the operational and/or compositional parameters of the ion-implantation process. The first section 722 of ion-implanted layer 704 may be formed by implanting a first group of ions, and second section 724 of ion-implanted layer 704 may be formed by implanting a second group of ions. First section 722 formed from the first group of ions substantially encircle and/or surround second section 724 formed from the second group of ions. Specifically, the first group of ions forming first section 722 may be distinct, materially or compositionally, from the second group of ions forming second section 724. In another non-limiting example, the composition of the first group of ions forming first section 722 may be distinct from or identical to the composition of the second group of ions forming second section 724, but the operational parameters for forming first section 722 may be distinct from the operational parameters for forming second section 724. In the non-limiting example, the energy level, the acceleration, the amount of ions and/or the temperature of the ions used in the ion-implantation process to form first section 722 of ion-implanted layer 704 may be distinct from those operational parameters used in the ion-implantation process to form second section 724.

As a result of the distinction in the composition of the ions and/or operational parameters for forming first section 722 and second section 724, the optical characteristics and/or the compositional characteristics for first section 722 and second section 724 may also be distinct. The first section 722 and second section 724 of ion-implanted layer 704 may include distinct indexes of refraction, and ultimately different anti-reflective (AR) characteristics. In a non-limiting example, first section 722 may include an inner or central portion of sapphire component 700, and second section 724 may include a border or boundary portion of sapphire component 700. In the non-limiting example, and based on the use or utilization of sapphire component 700, the inner or central portion of sapphire component 700 may require higher anti-reflective (AR) characteristics than the border portions of sapphire component 700. As such, the composition of the ions and/or operational parameters for forming first section 722 may be different than those forming second section 724, such that first section 722 includes higher anti-reflective characteristics than second section 724.

Figure 8:
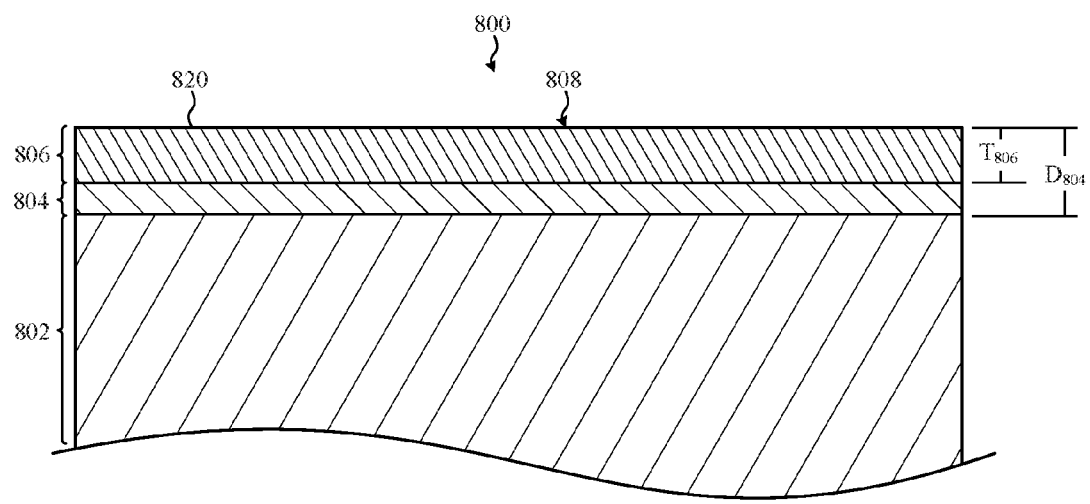
FIG. 8 shows a side view of a sapphire component having an ion-implanted layer and a top, annealed layer, according to an additional embodiment.

FIG. 8 shows a side cross-section view of sapphire component 800, which includes similar features as the sapphire components discussed herein with respect to FIGS. 1 and 5. Specifically, as shown in FIG. 8, sapphire component 800 includes internal layer 802, top, annealed layer 806 and ion-implanted layer 804 formed within sapphire component 800 between internal layer 802 and top, annealed layer 806. However, distinct from the sapphire components previously discussed, top, annealed layer 806 is primarily formed of a transition portion 820. As discussed herein with respect to FIG. 5, transition portion 820 includes material of sapphire component 800 that is implanted with ions and is subsequently annealed. In a non-limiting example shown in FIG. 8, top, annealed layer 806 is formed as transition portion 820, such that the material composition of top, annealed layer 806 is an annealed portion of ion-implanted layer 804. As a result, top, annealed layer 806 is not purely a sapphire material, as previously discussed, but rather is formed from annealed, ion-implanted sapphire material.

Top, annealed layer 806 formed as transition portion 820 is formed by first implanting ions within sapphire component 800 from exterior surface 808 to a predetermined depth ($D_{804}$) within sapphire component 800. As a result, sapphire component 800 temporarily includes only internal layer 802 and ion-implanted layer 804, which extends from exterior surface 808 to the predetermined depth ($D_{804}$) within sapphire component 800. Next, sapphire component 800 undergoes an annealing process, as similarly discussed herein, to form top, annealed layer 806 having a predetermined thickness ($T_{806}$). However, because the portion of sapphire component 800 formed directly adjacent exterior surface 808 includes ion-implanted material, top, annealed portion 806 is formed from annealed, ion-implanted material (e.g., transition portion 820).

Figure 9:
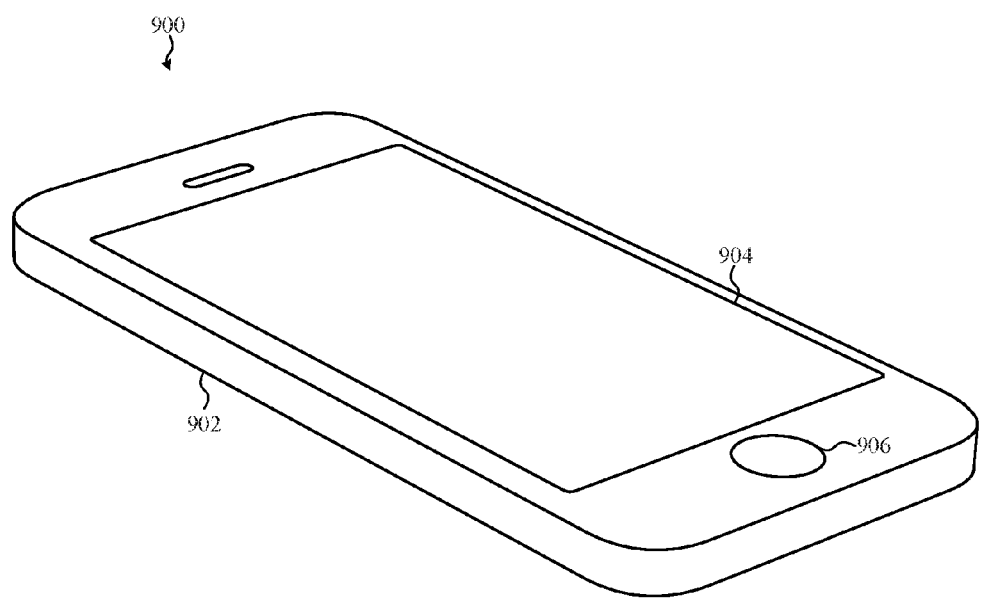
FIG. 9 shows an isometric view of an electronic device that may utilize the sapphire component having an ion-implanted layer and a top, annealed layer as discussed with respect to FIGS. 1-8, according to embodiments.

FIG. 9 shows an isometric view of an electronic device 900. As discussed herein, electronic device 900 may include various components that may utilize the sapphire structures discussed herein with respect to FIGS. 1 and 4-8. As shown in FIG. 9, electronic device 900 is implemented as a mobile phone. Other embodiments can implement electronic device 900 differently, such as, for example, as a laptop or desktop computer, a tablet computing device, a gaming device, a display, a digital music player, a wearable computing device or display, a health monitoring device, and so on.

Electronic device 900 includes a housing 902 at least partially surrounding a display module, a cover 904 substantially covering the display module and one or more buttons 906 or input devices. Housing 902 can form an outer surface or partial outer surface and protective case for the internal components of the electronic device 900, and may at least partially surround the display module positioned within an internal cavity formed by housing 902. Housing 902 can be formed of one or more components operably connected together, such as a front piece and a back piece (not shown). Alternatively, housing 902 can be formed of a single piece operably connected to the display module. Housing 902 may be formed from any suitable material that may house and/or may protect the internal components of electronic device 900, including the display module. In non-limiting examples, housing 902 may be formed from glass, sapphire or metal.

The display module may be substantially surrounded by housing 902 and/or may be positioned within an internal cavity formed by housing 902. The display module can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. The display module may be positioned within an internal cavity of housing 902 and may be substantially protected on almost all sides by housing 902.

Cover 904 may be formed integral with and/or may be coupled to housing 902 to substantially cover and protect the display module. Cover 904 may cover at least a portion of the front surface of electronic device 900. When a user interacts with the display module of electronic device 900, the user may touch or contact cover 904. Cover 904 of electronic device 900 may include the sapphire component discussed herein with respect to FIGS. 1 and 4-7, to reduce the reflective properties of the cover 904 formed from the sapphire component for electronic device 900. In a non-limiting example shown in FIG. 9, the sapphire component discussed herein (see, FIGS. 1-8) may form cover 904 coupled to housing 902 and positioned over the display module. By utilizing the sapphire component discussed herein to form cover 904 for electronic device 900, cover 904 may have improved anti-reflective properties and/or characteristics, which may improve visibility, usability and/or operation of the display module of electronic device 900.

Button 906 can take the form of a home button, which may be a mechanical button, a soft button (e.g., a button that does not physically move but still accepts inputs), an icon or image on a display, and so on. Further, in some embodiments, button 906 can be integrated as part of cover 904 of the electronic device 900. Button 906, like housing 902, may be formed from any suitable material that may withstand an undesirable drop event that may occur with electronic device 900. In non-limiting examples, button 906 may be formed from glass, sapphire or metal.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of forming an anti-reflective sapphire component comprising:
    forming an ion-implanted layer in a sapphire material at a first depth, the sapphire material having a composition; and
    annealing the sapphire material to a second depth that is greater than or equal to the first depth to form an annealed layer between an exterior surface of the sapphire material and the ion-implanted layer; wherein the ion-implanted layer has a first index of refraction and a composition including an amount of implanted ions greater than an amount of implanted ions in the annealed layer; and the annealed layer has a similar composition to the composition of the sapphire material, and the annealed layer has a second index of refraction different from the first index of refraction.

2. The method of claim 1, wherein:
the first index of refraction is less than the second index of refraction; and
a portion of the sapphire material below the ion-implanted layer has the second index of refraction.

3. The method of claim 1, wherein forming the ion-implanted layer comprises:
implanting a first group of ions within the sapphire material to form a first section of the ion-implanted layer; and
implanting a second group of ions within the sapphire material to form a second section of the ion-implanted layer; wherein
the second section of the ion-implanted layer is positioned adjacent the first section of the ion-implanted layer.

4. The method of claim 3, wherein:
the second group of ions and the first group of ions are implanted at the first depth; and
the first group of ions substantially encircles the second group of ions.

5. The method of claim 1, wherein forming the ion-implanted layer comprises:
implanting a first layer of ions below an exterior surface of the sapphire material; and
implanting a second layer of ions below the exterior surface of the sapphire material and above the first layer of ions, the second layer of ions distinct from the first layer of ions.

6. The method of claim 5, further comprising:
annealing the sapphire material prior to implanting the second layer of ions, thereby forming an intermediate, annealed layer ultimately positioned between the first layer of ions and the second layer of ions.

7. The method of claim 6, wherein annealing the sapphire material prior to implanting the second layer of ions comprises forming a top, annealed layer as the exterior surface of the sapphire material.

8. The method of claim 1, wherein annealing the sapphire material comprises locally annealing a portion of the sapphire material.

9. The method of claim 1, wherein annealing the sapphire material comprises forming a transition portion within the sapphire material that extends into the ion-implanted layer.

10. The method of claim 1, wherein the ion-implanted layer is formed at a thickness that is less than the first depth.

11. The method of claim 1, wherein:
the ion-implanted layer is formed at a thickness within the sapphire material and defines an upper interface and a lower interface;
the thickness of the ion-implanted layer is configured to induce a quarter-wavelength phase shift between a first portion of light reflecting from the upper interface and a second portion of light reflecting from the lower interface.

12. A sapphire component comprising:
an internal layer having a composition;
an ion-implanted layer formed between the internal layer and an exterior surface of the sapphire component, the ion-implanted layer having a first index of refraction and a composition including an amount of implanted ions greater than an amount of implanted ions in the internal layer; and
an annealed layer between the exterior surface and the ion-implanted layer, the annealed layer having a composition substantially similar to the composition of the internal layer and a second index of refraction that is different than the first index of refraction.

13. The sapphire component of claim 12, wherein the first index of refraction is lower than the second index of refraction.

14. The sapphire component of claim 12, wherein a thickness of the annealed layer is less than approximately 1 micron.

15. An electronic device comprising:
a housing;
a display module positioned within the housing; and
a sapphire cover coupled to the housing and positioned over the display module, the sapphire cover comprising:
an internal layer having a composition;
an ion-implanted layer formed within the sapphire cover above the internal layer and having a first index of refraction and a composition including an amount of implanted ions greater than an amount of implanted ions in the internal layer; and
an annealed layer positioned above the ion-implanted layer and forming an exterior surface of the sapphire cover, the annealed layer having a second index of refraction different than the first index of refraction and a composition substantially similar to the composition of the internal layer.

16. The electronic device of claim 15, wherein the ion-implanted layer comprises:
a first section comprising a first group of ions implanted in the first section; and
a second section positioned adjacent the first section, the second section comprising a second group of ions implanted in the second section; wherein
the first group of ions is distinct from the second group of ions.

17. The electronic device of claim 15, wherein:
the ion-implanted layer is a first ion-implanted layer; and
a second ion-implanted layer is positioned between the exterior surface and the first ion-implanted layer.

18. The electronic device of claim 17, wherein:
the first ion-implanted layer is separated from the second ion-implanted layer by an intermediate annealed layer; and
the second ion-implanted layer is positioned between the intermediate annealed layer and a top annealed layer.

19. The electronic device of claim 18, wherein the intermediate annealed layer is compositionally similar to the annealed layer.

* * * * *

UNITED STATES PATENT AND TRADEMARK OFFICE
CERTIFICATE OF CORRECTION

PATENT NO. : 10,280,504 B2
APPLICATION NO. : 15/269899
DATED : May 7, 2019
INVENTOR(S) : Matthew S. Rogers, Avery P. Yuen and Xianwei Zhao Page 1 of 1

It is certified that error appears in the above-identified patent and that said Letters Patent is hereby corrected as shown below:

In the Claims

In Claim 1, Column 21, Line 8, change "refraction." to --refraction, wherein the annealed layer has a thickness of 200 nm to 1 micron.--

In Claim 12, Column 22, Line 13, change "refraction." to --refraction, wherein the annealed layer has a thickness of 200 nm to 1 micron.--

In Claim 15, Column 22, Line 39, change "layer." to --layer, wherein the annealed layer has a thickness of 200 nm to 1 micron.--

Signed and Sealed this
Second Day of July, 2019

Andrei Iancu
*Director of the United States Patent and Trademark Office*